(12) United States Patent
Azizgolshani

(10) Patent No.: US 11,701,652 B2
(45) Date of Patent: Jul. 18, 2023

(54) SYSTEMS AND METHODS FOR MANUFACTURING CLOSED MICROFLUIDIC DEVICES

(71) Applicant: The Charles Stark Draper Laboratory, Inc., Cambridge, MA (US)

(72) Inventor: Hesham Azizgolshani, Belmont, MA (US)

(73) Assignee: The Charles Stark Draper Laboratory, Inc., Cambridge, MA (US)

( * ) Notice: Subject to any disclaimer, the term of this patent is extended or adjusted under 35 U.S.C. 154(b) by 244 days.

(21) Appl. No.: 17/031,146

(22) Filed: Sep. 24, 2020

(65) Prior Publication Data

US 2021/0086178 A1    Mar. 25, 2021

Related U.S. Application Data

(60) Provisional application No. 62/905,665, filed on Sep. 25, 2019.

(51) Int. Cl.
*C12N 15/10*    (2006.01)
*B01L 3/00*    (2006.01)
(Continued)

(52) U.S. Cl.
CPC .... *B01L 3/502707* (2013.01); *B29C 45/1671* (2013.01); *B01L 2200/027* (2013.01);
(Continued)

(58) Field of Classification Search
CPC ......... B01L 3/502707; B01L 2200/027; B01L 2200/0689; B01L 2200/12;
(Continued)

(56) References Cited

U.S. PATENT DOCUMENTS

| 2003/0026740 A1* | 2/2003 | Staats | H01J 49/04 422/503 |
|---|---|---|---|
| 2004/0069717 A1 | 4/2004 | Laurell et al. | |
| 2006/0103051 A1 | 5/2006 | Staats | |

FOREIGN PATENT DOCUMENTS

WO    WO-2012/017515 A1    2/2012

OTHER PUBLICATIONS

Chia-Wen Tsao et al: 11 Bonding of thermoplastic polymer microfluidics 11, Microfluidi CS and Nano Fluid ICS, Springer, Berlin, DE, vol. 6, No. 1, Nov. 13, 2008 (Nov. 13, 2008), pp. 1-16.
(Continued)

*Primary Examiner* — Jennifer Wecker
*Assistant Examiner* — Oyeleye Alexander Alabi
(74) *Attorney, Agent, or Firm* — Foley & Lardner LLP

(57) ABSTRACT

A method for manufacturing a microfluidic device can include providing a base component to define a first portion of the microfluidic device. A cap component of the microfluidic device can be fabricated with a sealing lip extending a first distance from a first side of the cap component and a support portion extending a second distance, less than the first distance, from the first side of the cap component. The method can include positioning the cap component and the base component within a mold to bring the sealing lip of the cap component in contact with the base component. The base component, the support portion of the cap component, and the sealing lip of the cap component together can define a cavity. The method can include injecting a polymer material into the mold to cause the polymer material to fill the cavity.

5 Claims, 16 Drawing Sheets

(51) Int. Cl.
  B01L 7/00 (2006.01)
  F28F 3/12 (2006.01)
  G01N 35/10 (2006.01)
  B29C 45/16 (2006.01)
  B29K 25/00 (2006.01)
  B29K 105/00 (2006.01)
  B29L 31/00 (2006.01)

(52) U.S. Cl.
  CPC ... *B01L 2200/0689* (2013.01); *B01L 2200/12* (2013.01); *B01L 2300/042* (2013.01); *B01L 2300/123* (2013.01); *B01L 2300/168* (2013.01); *B29C 2045/1673* (2013.01); *B29K 2025/06* (2013.01); *B29K 2105/0085* (2013.01); *B29L 2031/756* (2013.01)

(58) Field of Classification Search
  CPC ......... B01L 2300/042; B01L 2300/123; B01L 2300/168; B01L 2300/0829; B01L 2300/0887; B01L 3/50255; B29C 45/1671; B29C 2045/1673; B29K 2025/06; B29K 2105/0085; B29L 2031/756; B81B 2201/058; B81C 1/00071; B81C 3/008
  See application file for complete search history.

(56) References Cited

OTHER PUBLICATIONS

International Preliminary Report on Patentability on PCT Appln No. PCT/US2020/052470 dated Apr. 7, 2022.
International Search Report and Written Opinion on PCT Appln. PCT/US2020/052470 dated Feb. 4, 2021.

\* cited by examiner

SYSTEMS AND METHODS FOR MANUFACTURING CLOSED MICROFLUIDIC DEVICES

CROSS REFERENCE TO RELATED APPLICATIONS

The present application claims priority under 35 U.S.C. § 119(e) to U.S. Provisional Patent Application No. 62/905,665, titled "SYSTEMS AND METHODS FOR MANUFACTURING CLOSED MICROFLUIDIC DEVICES," filed Sep. 25, 2019, which is incorporated herein in its entirety by reference.

BACKGROUND

Microfluidic devices can include features such as channels, chambers, and wells. It can be difficult to produce microfluidic devices such that layers of the microfluidic device bond to one another in a manner that avoids damaging the layers or distorting the dimensions of the device.

SUMMARY

The present disclosure describes systems and methods for manufacturing a microfluidic device. The microfluidic device can be a closed microfluidic device. Such a device can include one or more features such as channels, chambers, wells, or other voids defined within a substrate or other solid component that may be at least partially enclosed around the microfluidic features. For example, a microfluidic device can include a substrate or base component that defines a channel, a chamber, or a well, as well as a cap component. The cap component can enclose at least a portion of the channel, chamber, or well. In some implementations, the cap component may include at least one opening that is in fluid communication with the channel, chamber, or well, to allow fluid to be introduced into the microfluidic device. The base component and the cap component can be fabricated separately and adhered or bonded to one another to form the microfluidic device. However, conventional bonding techniques can have adverse effects on the materials that form the base component and cap component. For example, some bonding techniques may burn or melt portions of the base component or cap component. As a result, the microfluidic device may have dimensions that are distorted as a result of such burning or melting.

To address the foregoing issues, the present disclosure provides systems and methods for manufacturing a closed microfluidic device in a manner that overcomes these challenges. In some implementations, the geometry and dimensions of the base component or the cap component can be selected to facilitate injection molding in a manner that prevents or reduces deformation of the microfluidic device that may otherwise occur as a result of temperatures and pressures applied during the molding process or other bonding techniques.

At least one aspect of the present disclosure is directed to a method. The method can include providing a base component to define a first portion of a channel of a microfluidic device. The method can include fabricating a cap component of the microfluidic device. The cap component can include a sealing lip extending a first distance from a first side of the cap component and a support portion extending a second distance. The second distance can be less than the first distance. The support portion can extend from the first side of the cap component. The method can include positioning the cap component and the base component within a mold to bring the sealing lip of the cap component in contact with the base component. The base component can be spaced away from the support portion of the cap component by a third distance equal to a difference between the first distance and the second distance. The method can include injecting a polymer material into the mold to cause the polymer material to fill at least a portion of a cavity defined by the base component, the support portion of the cap component, and the sealing lip of the cap component. The cavity can be sealed from the channel of the microfluidic device by the sealing lip of the cap component. The method can include curing the polymer material to secure the base component to the cap component.

In some implementations, the method can include forming an optical layer comprising a transparent material. In some implementations, the method can include coupling the optical layer to one of the base component or the cap component to facilitate observation of the microfluidic device. In some implementations, the method can include coupling the optical layer to the one of the base component or the cap component using at least one of laser welding, ultrasonic welding, solvent bonding, or thermal bonding. In some implementations, the base component and the cap component are formed from a material different from the polymer material injected into the cavity.

In some implementations, the polymer material comprises at least one of: cyclic olefin polymer (COP), cyclic olefin copolymer (COC), or polystyrene. In some implementations, the cap component defines a ceiling or a sidewall of the channel of the microfluidic device. In some implementations, the cap component comprises a well plate defining at least one opening configured to be in fluidic communication with the channel of the microfluidic device after curing the polymer material. In some implementations, the method can include fabricating the cap component comprising the well plate using injection molding. In some implementations, the cap component is fabricated such that the sealing lip at least partially surrounds the at least one opening of the well plate. In some implementations, the base component further defines at least a portion of a second channel. In some implementations, the first channel and the second channel can be separated by a semi-permeable membrane.

In some implementations, the method can include positioning a first side of a membrane in contact with a first solid support structure within a mold. In some implementations, the method can include injection molding a first channel layer over a second side of the membrane, opposite the first side of the membrane, to cause the first channel layer to adhere to the second side of the membrane. The first channel layer can define at least a portion of the first channel. In some implementations, the method can include replacing the first solid support structure with a second solid support structure within the mold. The second solid support structure can be in contact with the first side of the membrane. The second solid support structure can have a shape corresponding to a second network of channels including the second channel. In some implementations, the method can include injection molding a second channel layer on the first side of the membrane to cause the second channel layer to adhere to the first side of the membrane. The second channel layer can define the second network of channels including at least a portion of the second channel. In some implementations, the cap component is fabricated such that the sealing lip of the cap component comprises a beveled edge.

At least one other aspect of the present disclosure is directed to a microfluidic device. The microfluidic device can include a base component defining at least a portion of a first channel of the microfluidic device. The microfluidic device can include a cap component comprising a sealing lip extending a first distance from a first side of the cap component and a support portion extending a second distance. The second distance can be less than the first distance. The support portion can extend from the first side of the cap component. The microfluidic device can include a polymer material filling at least a portion of a cavity defined by the base component, the support portion of the cap component, and the sealing lip of the cap component. The cavity can be sealed from the channel of the microfluidic device by the sealing lip of the cap component. The polymer material can be injection molded to fill the cavity and cured to secure the base component to the cap component.

In some implementations, the microfluidic device can include a second channel complementary to the first channel. The second channel can be defined at least in part by the base component of the microfluidic device. In some implementations, the microfluidic device can include a semipermeable membrane separating the first channel from the second channel. In some implementations, the microfluidic device can include a well plate formed as part of the cap component of the microfluidic device. The well plate can define at least one opening in fluidic communication with the first channel or the second channel of the microfluidic device. In some implementations, the microfluidic device can include an optical layer coupled with the base component or the cap component to facilitate observation of the microfluidic device.

At least one other aspect of the present disclosure is directed to a method. The method can include positioning a first side of a membrane in contact with a first solid support structure within a mold. The method can include injection molding a first channel layer over a second side of the membrane, opposite the first side of the membrane, to cause the first channel layer to adhere to the second side of the membrane. The first channel layer can define a first network of channels. The method can include replacing the first solid support structure with a second solid support structure within the mold. The second solid support structure can be in contact with the first side of the membrane. The second solid support structure can have a shape corresponding to a second network of channels. The method can include injection molding a second channel layer on the first side of the membrane to cause the second channel layer to adhere to the first side of the membrane. The second channel layer can define the second network of channels. The method can include providing a well plate defining at least one opening. The well plate can include a sealing lip extending a first distance from a first side of the well plate and a support portion extending a second distance. The second distance can be less than the first distance. The support portion can extend from the first side of the well plate. The sealing lip can at least partially surround the at least one opening. The method can include positioning the well plate within the mold to bring the sealing lip of the well plate in contact with the first channel layer and to align the at least one opening of the well plate with at least one channel of the first network of channels. The first channel layer can be spaced away from the support portion of the well plate by a third distance equal to a difference between the first distance and the second distance. The method can include injecting a polymer material into the mold to cause the polymer material to fill at least a portion of a cavity defined by the first channel layer, the support portion of the well plate, and the sealing lip of the well plate. The cavity can be sealed from the channel of the microfluidic device by the sealing lip of the cap component. The method can include curing the polymer material to secure the well plate to the first channel layer.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification. Aspects can be combined and it will be readily appreciated that features described in the context of one aspect of the invention can be combined with other aspects. Aspects can be implemented in any convenient form.

BRIEF DESCRIPTION OF THE DRAWINGS

The accompanying drawings are not intended to be drawn to scale. Like reference numbers and designations in the various drawings indicate like elements. For purposes of clarity, not every component may be labeled in every drawing. The foregoing and other objects, aspects, features, and advantages of the disclosure will become more apparent and better understood by referring to the following description taken in conjunction with the accompanying drawings, in which.

DETAILED DESCRIPTION

The various concepts introduced above and discussed in greater detail below may be implemented in any of numerous ways, as the described concepts are not limited to any particular manner of implementation. Examples of specific implementations and applications are provided primarily for illustrative purposes.

The present disclosure describes systems and methods for manufacturing a microfluidic device. The microfluidic device can be a closed microfluidic device. Such a device can include one or more features such as channels, chambers, wells, or other voids defined within a substrate or other solid component that may be at least partially enclosed around the microfluidic features. For example, a microfluidic device can include a substrate or base component that defines a channel, a chamber, or a well, as well as a cap component. The cap component can enclose at least a portion of the channel, chamber, or well. In some implementations, the cap component may include at least one opening that is in fluid communication with the channel, chamber, or well, to allow fluid to be introduced into the microfluidic device.

The base component and the cap component can be fabricated separately and adhered or bonded to one another to form the microfluidic device. However, conventional bonding techniques can have adverse effects on the materials that form the base component and cap component. For example, some bonding techniques may burn or melt portions of the base component or cap component. As a result, the microfluidic device may have dimensions that are distorted as a result of such burning or melting. This disclosure provides systems and methods for manufacturing a closed microfluidic device in a manner that overcomes these challenges. In some implementations, the geometry and dimensions of the base component or the cap component can be selected to facilitate injection molding in a manner that prevents or reduces deformation of the microfluidic device that may otherwise occur as a result of temperatures and pressures applied during the molding process.

Figure 1:
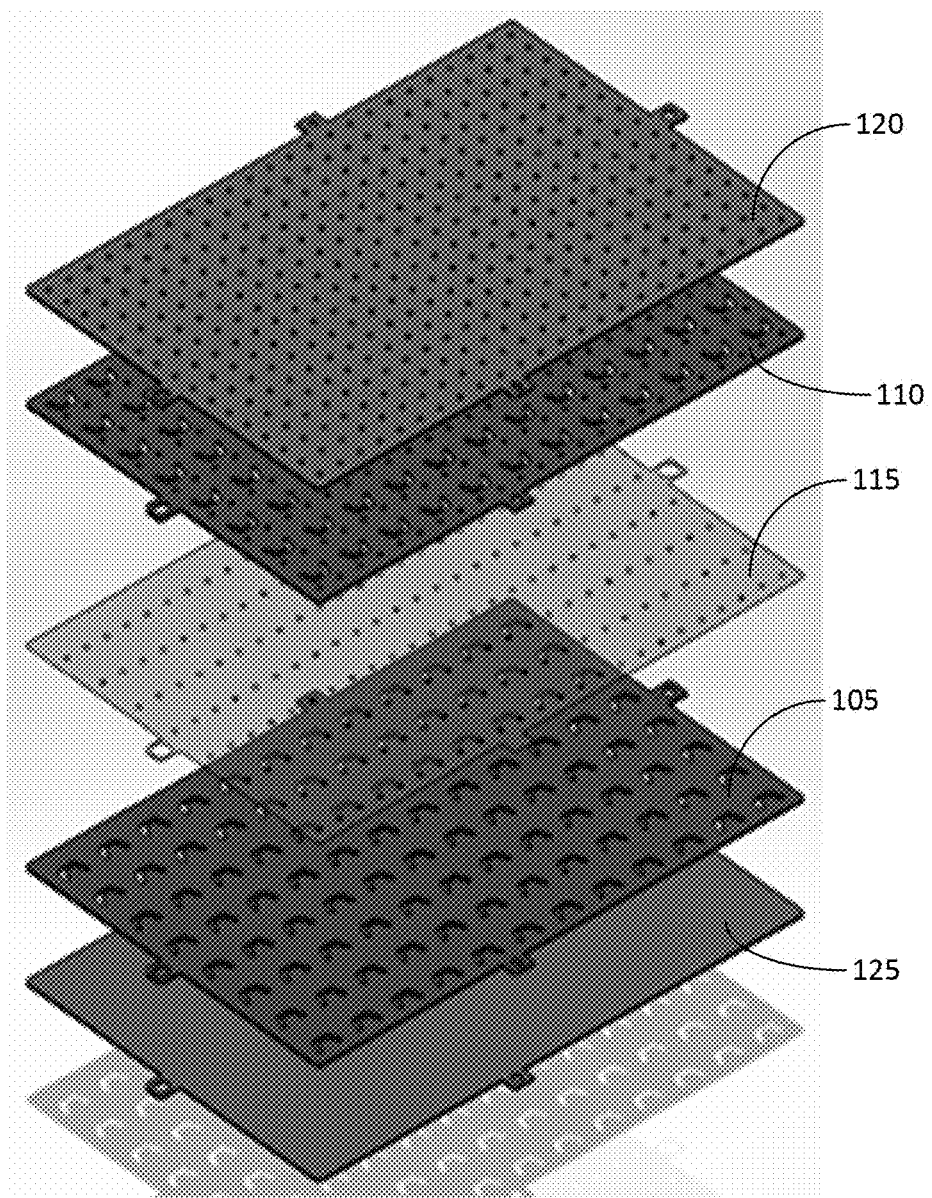
FIG. 1 illustrates an exploded view of an example material stack for forming a microfluidic device.

FIG. 1 illustrates an exploded view of an example material stack for forming a microfluidic device 100. The microfluidic device 100 can include a plurality of layers that form the material stack. For example, the microfluidic device 100 can include a basal channel layer 105 and an apical channel layer 110. The basal channel layer 105 and the apical channel layer 110 can be separated from one another by a permeable membrane 115. The basal channel layer 105 and the apical channel layer 110 can each define a respective network of one of more channels. Channels in the basal channel layer 105 can be complimentary to respective channels in the apical channel layer 110. For example, portions of the channels in the apical channel layer 110 can overlap with portions of channels in the in the basal channel layer 105, with the overlapping portions in fluid communication with one another through the membrane 115. As a result, interactions between substances in the channels of the basal channel layer 105 and the channels of the apical channel layer 110 can occur.

The microfluidic device 100 also includes a port layer 120. The port layer 120 can include openings or ports that can be aligned with channels in either the basal channel layer 105 or the apical channel layer 110. Fluid samples can be introduced into the channels of the basal channel layer 105 and the apical channel layer 110 via the ports of the port layer 120. The microfluidic device 100 can also include an optical layer 125. The optical layer 125 can provide optical access to the channels of the basal channel layer 105. For example, the optical layer 125 can serve as an interface through which substances (e.g., fluid samples, cells, etc.) can be observed or imaged, such as with a microscope or other optical equipment. The microfluidic device 100 can also include additional or different layers not depicted in FIG. 1. For example, the microfluidic device 100 can include or be coupled to a well plate. The well plate can be integrated with the port layer 120. The well plate also can be formed separately from the port layer 120, and be positioned to interface with the port layer 120.

The microfluidic device 100 can be formed by bonding the layers shown in FIG. 1 to one another. However, conventional bonding techniques applied to these layers can cause problems in the resulting microfluidic device 100. For example, bonding may require exposure of the layers to heat and pressure for long and repeated bond cycles. This can lead to shrinkage of certain portions of the layers, thereby resulting in poor alignment between adjacent layers. In some implementations, layers of the microfluidic device 100 can be formed from polymer materials, such as cyclic olefin polymer (COP), cyclic olefin copolymer (COC), or polystyrene. However, material selection may further complicate the bonding process. For example, there may be a mismatch in coefficients of thermal expansion of materials used for adjacent layers, which can cause one or more of the layers to smear or become distorted during a bonding process that requires the application of heat. In some examples, either or both of the membrane 115 or the optical layer 125 may become distorted and therefore exhibit poor "flatness" after the bonding process, leading to decreased performance of the microfluidic device 100.

Figure 2:
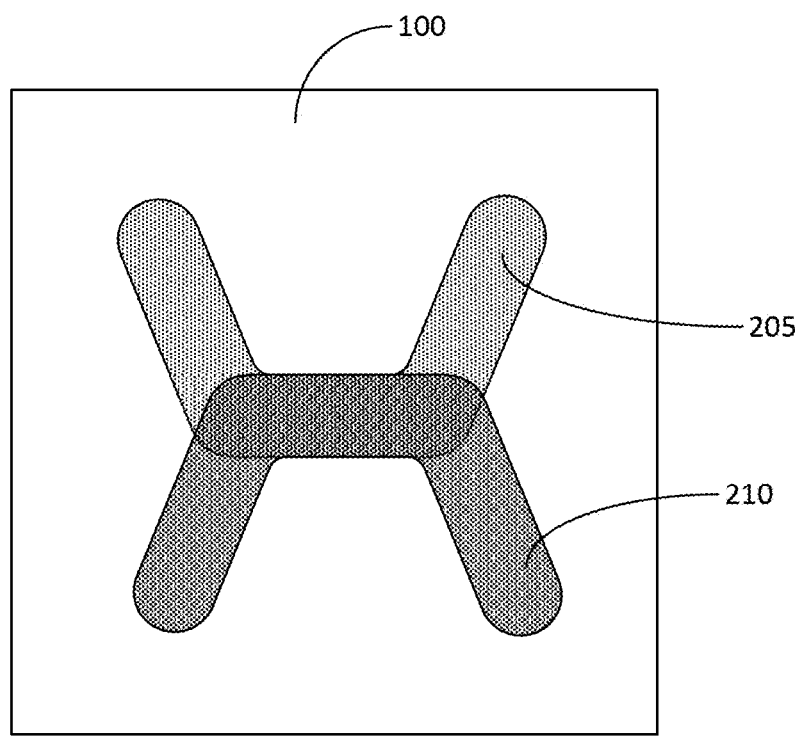
FIG. 2 illustrates a top view of a portion of the microfluidic device illustrated in FIG. 1.

FIG. 2 illustrates a top view of a portion of the microfluidic device 100 illustrated in FIG. 1. The view of FIG. 2 depicts a channel 205 of the basal channel layer 105 and another channel 210 of the apical channel layer 110. The channel 205 can be formed as a part of the basal channel layer 105, for example as a recess or defined open region within the substrate of the basal channel layer 105. Likewise, the other channel 210 can be formed as a part of the apical channel layer 110, for example as a recess or defined open region within the substrate of the apical channel layer 110. Each of the channels 205 and 210 can include a central portion as well as arm portions. The central portions of the channels 205 and 210 can overlap with one another. In some implementations, the central portions of the channels 205 and 210 can be separated from one another by the membrane 115 (not shown in FIG. 2) such that the channels 205 and 210 are in fluid communication with one another through the membrane 115. The channels 205 and 210 can be separated by any type of membrane or separation layer, such as a scaffold, semipermeable membrane, or other type of separation layer.

In some implementations, the arm portions of the channels 205 and 210 can extend in various directions, including opposing directions, such that the channels 205 and 210 may not fully align with one another along their entire lengths. As a result, sections of the basal channel layer 105 that are positioned adjacent to the arm portion of the channel 210 defined by the apical channel layer 110 may be unsupported by the apical channel layer 110 itself, during the bonding process. Likewise, sections of the apical channel layer 110 that are positioned adjacent to the arm portion of the channel 205 defined by the basal channel layer 105 may be unsupported by the basal channel layer 105 itself. These unsupported sections could collapse into the arm portion of the underlying channel in the adjacent layer when subjected to temperature and pressure during a bonding process. This can result in additional material deformation of the layers, as well as poor bond quality.

Figure 3:
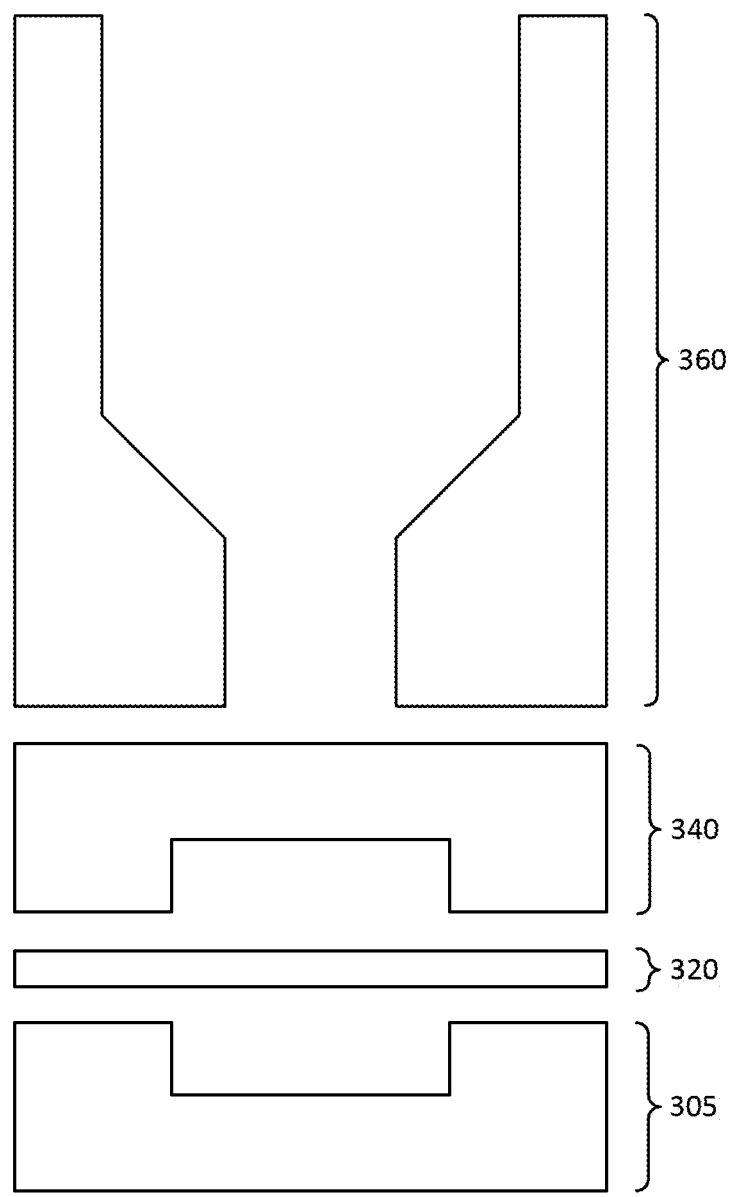
FIG. 3 illustrates a cross-sectional view of an example material stack for forming a microfluidic device similar to the microfluidic device illustrated in FIG. 1.

FIG. 3 illustrates a cross-sectional view of an example material stack 300 for forming a microfluidic device similar to the microfluidic device 100 illustrated in FIG. 1. The stack 300 can include at least one basal channel layer 305, at least one membrane 320, and at least one apical channel layer 340. The membrane 320 can separate the basal channel layer 305 from the apical channel layer 340. The stack 300 also includes a well plate 360.

In some implementations, the layers of the stack 300 can be formed separately from one another. After formation, the layers can be bonded together to form a complete microfluidic device, such as the microfluidic device 100 depicted in FIG. 1. For example, the layers can be bonded to one another by ultrasonic welding (sometimes referred to as "ultrasonic bonding"). Ultrasonic welding can include subjecting the layers of the stack 300 to high frequency vibrations, which can generate heat at the interface of adjacent layers of the stack 300. However, ultrasonic welding may require that the materials subjected to the high-frequency vibrations are compatible with one another. For example, ultrasonic welding may require material compatibility between adjacent layers (e.g., COP/COP or COP/COC used for adjacent layers as well as that of the semi-permeable membrane 320) so that the adjacent layers have similar glass transition temperatures, thereby limiting design choices for the material stack 300. In addition, ultrasonic bonding may result in significant "flash", or excess material. This excess material may obstruct or interfere with portions of the microfluidic device 100, or otherwise cause an undesirable outcome.

In some implementations, one or more pairs of adjacent layers in the stack 300 may be bonded to one another using ultrasonic welding, and other pairs of adjacent layers in the stack 300 may be bonded using other techniques. In some other implementations, the basal channel layer 305, the membrane 320, and the apical channel layer 340 can be bonded using other means, and the well plate 360 can be adhered to the apical channel layer 340 via ultrasonic bonding. In either case, ultrasonic bonding may result in poor uniformity of the bond in areas where ultrasonic energy is poor, and may risk collapse or deformation of either or both of the basal channel layer 305 and the apical channel layer 340 into their respective channels.

In some implementations, one or more pairs of adjacent layers in the stack 300 may instead be bonded using an insert molding technique. For example, the basal channel layer 305, the membrane 320, and the apical channel layer 340 can first be adhered to one another using any bonding technique, and then well plate 360 can be over-molded on the apical channel layer 340 inside a mold. However, similar to ultrasonic bonding, insert molding techniques may risk collapse or deformation of either or both of the basal channel layer 305 and the apical channel layer 340 into their respective channels when temperature and pressure are applied inside the mold.

Figure 4:
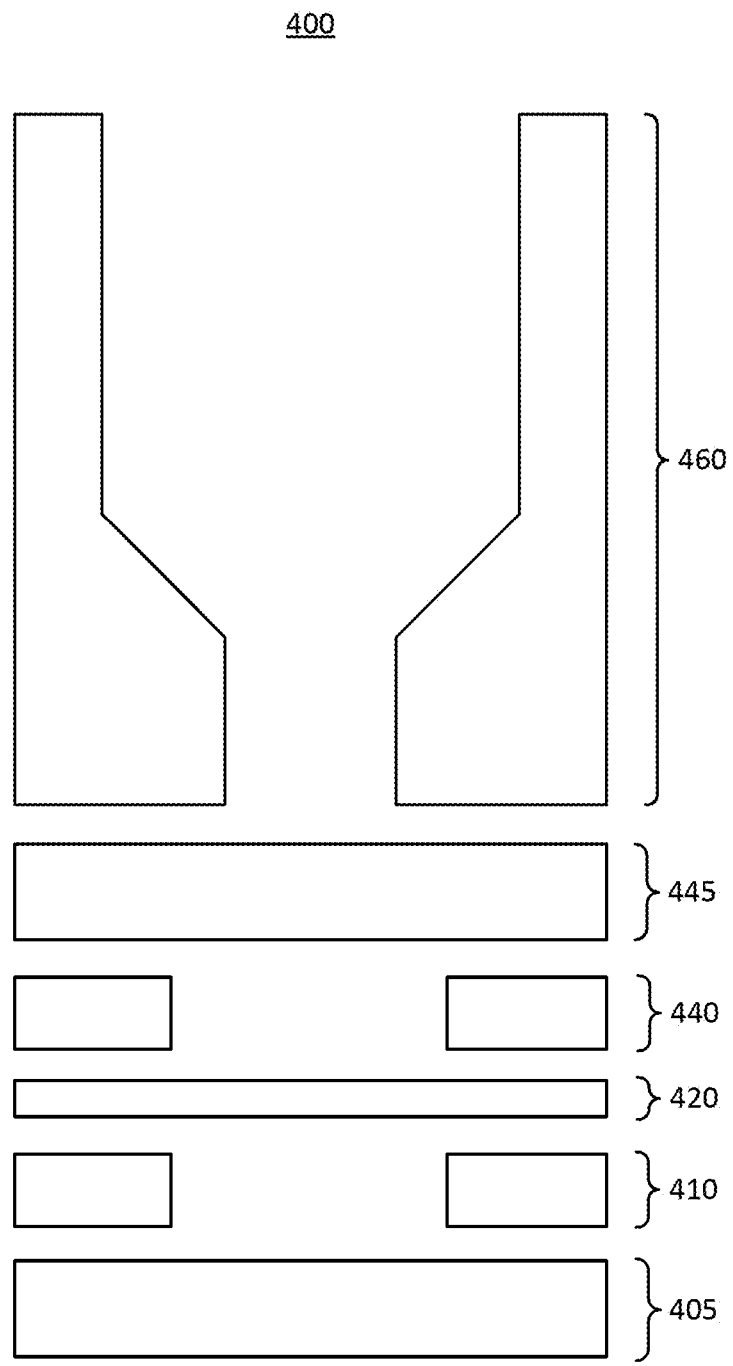
FIG. 4 illustrates a cross-sectional view of another example material stack for forming a microfluidic device similar to the microfluidic device illustrated in FIG. 1.

FIG. 4 illustrates a cross-sectional view of another example material 400 stack for forming a microfluidic device similar to the microfluidic device 100 illustrated in FIG. 1. The stack 400 can be similar to the stack 300 shown in FIG. 3, however certain layers depicted in FIG. 3 are formed from more than one layer in the stack 400 of FIG. 4. For example, in the stack 400, a basal channel layer (e.g., the basal channel layer 305 described herein above in conjunction with FIG. 3, etc.) can be formed form a first layer 405 and a second layer 410, and an apical channel layer (e.g., the apical channel layer 340 described herein above in conjunction with FIG. 3, etc.) can be formed from a first layer 440 and a second layer 445. A membrane 420 can separates the basal channel layer from the apical channel layer. In particular, the membrane 420 can be positioned between the layer 410 which forms a portion of the basal channel layer and the layer 440 that forms a portion of the apical channel layer. The stack 400 also includes a well plate 460.

Figure 5:
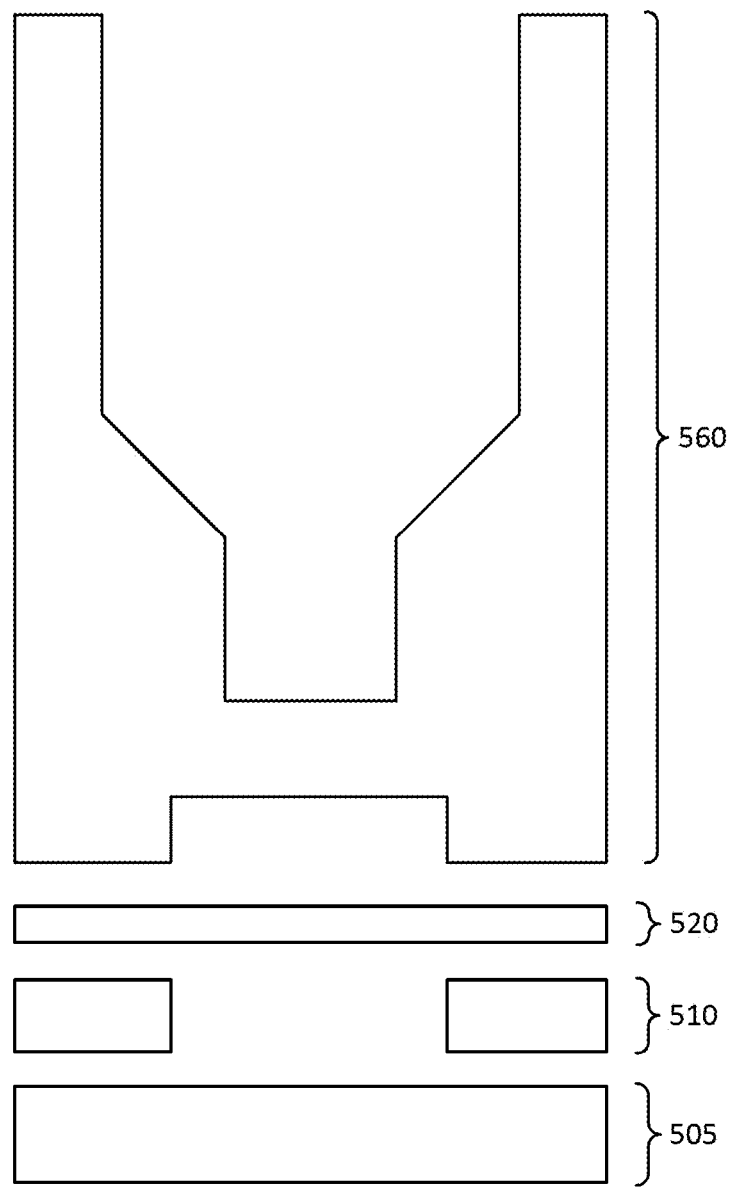
FIG. 5 illustrates a cross-sectional view of another example material stack for forming a microfluidic device similar to the microfluidic device illustrated in FIG. 1.

In some implementations, one or more of the layers of the stack 400 can be formed separately from one another. The layers can be bonded together to form a complete microfluidic device. In some implementations, at least some pairs of adjacent layers in the stack 400 can be bonded together using laser welding. In a laser welding process, laser energy can be passed through one layer and absorbed by another layer to heat and melt the interface between the two layers. Thus, the materials of the adjacent layers must be carefully selected. In addition, laser welding can risk burning or deforming a portion of layers. Bonding of the membrane 420 to the adjacent layers 420 and 440 also may be poor in unsupported areas, resulting in leak paths FIG. 5 illustrates a cross-sectional view of an example material stack 500 for forming a microfluidic device similar to the microfluidic device 100 illustrated in FIG. 1. The stack 500 can be similar to the stack 400 shown in FIG. 4 or the stack 300 shown in FIG. 3, however certain layers of the stack 400 depicted in FIG. 4 or the stack 300 depicted in FIG. 3 can be formed integrally with one another in the stack 500 of FIG. 5. For example, in the stack 500, an apical channel layer (e.g., formed from the layers the first layer 440 and the second layer 445 in the stack 400 of FIG. 4, the basal channel layer 340 in the stack 300 of FIG. 3, etc.) can formed integrally with the well plate, as an integrated apical channel 560. In some implementations, the integrated apical channel 560 shown in FIG. 5 can be formed by injection molding. In some implementations, the integrated apical channel 560 can be formed via other manufacturing processes, such as those described herein. The stack 500 can include a basal channel layer formed from layers 505 and 510 (e.g., similar to the layer 405 and a second layer 410, etc.), as well as a membrane 520.

In some implementations, the layers of the stack 500 below the well plate 560 can be adhered to one another sequentially via laser welding to create the final microfluidic device. However, defects similar to those described above in connection with FIG. 4 may be introduced due to laser welding. For example, burning or material deformation may occur, particularly because multiple sequential laser welds may be required. Similarly, there may be a poor bond between the membrane 520 and adjacent layers, and in some circumstances the membrane 520 may exhibit poor flatness.

Figure 6:
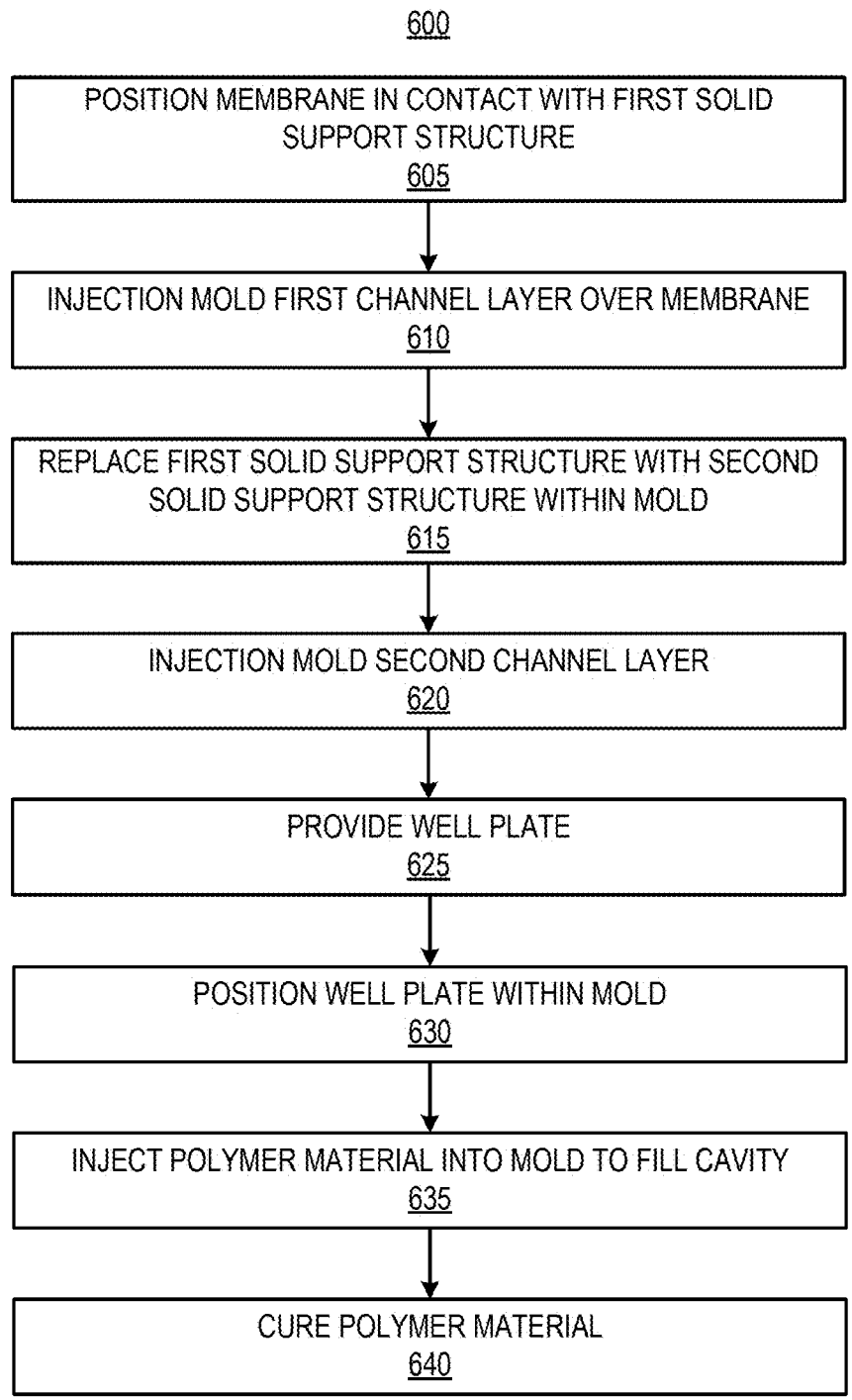
FIG. 6 illustrates a flowchart of an example method for fabricating a closed microfluidic device.

FIG. 6 illustrates a flowchart of an example method 600 for fabricating a closed microfluidic device. FIGS. 7A-7G illustrate cross-sectional views of stages of construction of an example microfluidic device manufactured according to the example method 600 of FIG. 6. FIGS. 6 and 7A-7G are described together below.

Referring now to FIG. 6, the method 600 can include positioning a membrane in contact with a first solid support structure (BLOCK 605). The method 600 can include injection molding a first channel layer over the membrane (BLOCK 610). The method 600 can include replacing the first solid support structure with a second solid support structure within the mold (BLOCK 615). The method 600 can include injection molding a second channel layer (BLOCK 620). The method 600 can include providing a well plate (BLOCK 625). The method 600 can include positioning the well plate within the mold (BLOCK 630). The method 600 can include injecting a polymer material into the mold to fill a cavity defined by the first channel layer and portions of the well plate (BLOCK 635). The method 600 can include curing the polymer material (BLOCK 640).

Figure 7A:
FIGS. 7A-7G illustrate cross-sectional views of stages of construction of an example microfluidic device manufactured according to the example method of FIG. 6.

Referring again to FIG. 6, and in greater detail, the method 600 can include positioning a membrane in contact with a first solid support structure (BLOCK 605). The results of this stage are shown in FIG. 7A. As depicted, the first solid support structure 705 can include a rectangular cross-sectional shape. Such a shape can provide a flat surface over which the membrane 720 can be positioned. For example, the flat surface provided by the first solid support structure 705 can help to ensure that the membrane 720 retains a flat or planar shape. In some implementations, the membrane 720 can be similar to the membranes 115, 320, 420, and 520 depicted in FIGS. 1 and 3-5. For example, the membrane can be a layer of material formed from a polymer such as polycarbonate and defining a series of pores having a size selected to allow particles of a desired size or weight to pass through the membrane 720. In some implementations, the solid support structure 705 can have local features that can enable tensioning of the membrane 720. For example, a geometry of the solid support structure 705 can be selected to impart tension on the membrane 720.

Figure 7B:
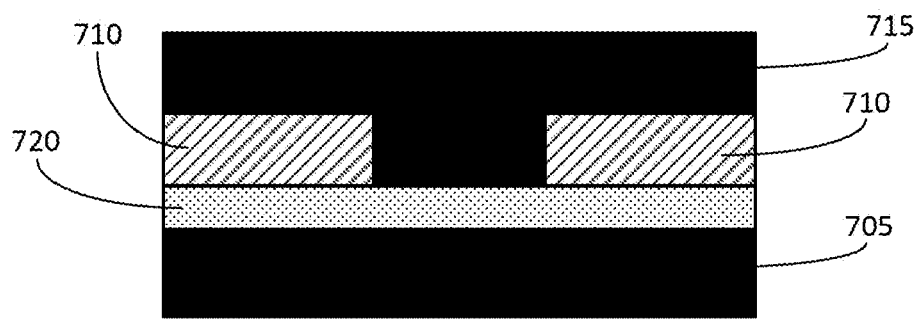

The method 600 can include injection molding a first channel layer over the membrane (BLOCK 610). The results of this stage are depicted in FIG. 7B. To form the mold for this step, another insert or support structure 715 can be used. The support structure 715 can be positioned on the opposite side of the membrane 720 from the first support structure 705. In some implementations, the support structure 715 can be shaped as a negative of the first channel layer 710. For example, the support structure 715 can have a void in areas in which the first channel layer 710 is solid, and can be solid in areas that will define voids (e.g., a channel, a chamber, etc.) in the first channel layer 710. A polymer material, such as COC, COP, or polystyrene, among others, can be injected into the mold to fill the voids in the support structure 715, thereby defining the first channel layer 710.

Figure 7C:
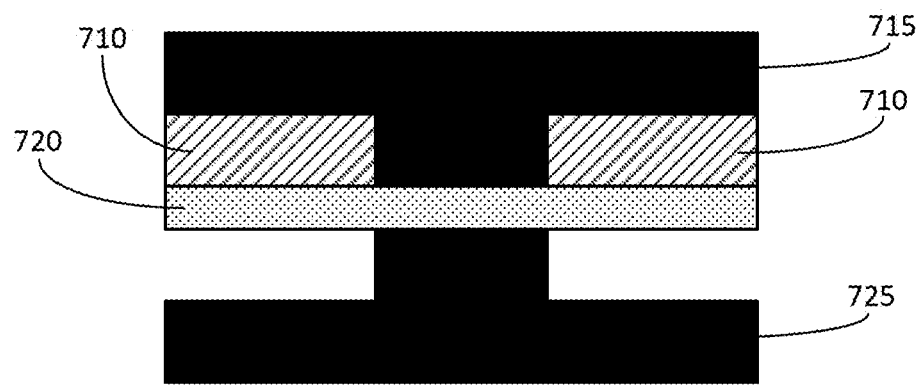

The method 600 can include replacing the first solid support structure 705 with a second solid support structure within the mold (BLOCK 615). The results of this stage are shown in FIG. 7C. As depicted, the first support structure 705 has been removed, and a second solid support structure 725 has been positioned in its place. The first solid support structure 705 can be removed, for example, by mechanical removal, or by dissolving or otherwise removing the first support structure 705 using a solvent or other chemical reaction. Unlike the first support structure 705, the second solid support structure 725 may not have a rectangular cross sectional shape. Instead, the second solid support structure 725 can have a shape selected according to a desired shape of a second channel layer to be formed in a subsequent operation. In some implementations, the second support structure 725 can be shaped as a negative of the second channel layer. For example, the second support structure 725 can have voids in areas in which the second channel layer is solid, and can be solid in areas that will define voids (e.g., a channel, a chamber, etc.) in the second channel layer. In some implementations, the second solid support structure 725 can have a shape that is similar to the shape of the support structure 715. As a result, the second solid support structure 725 can be used to fabricate a second channel layer having a network of channels that is complementary to the network of channels defined by the first channel layer 710. In this disclosure, channels may be referred to as "complementary" if a portion of the channels overlap with one another. In some implementations, a membrane such as the membrane 720 may separate the overlapping portion of complementary channels. In some implementations, a channel and its complement can be in fluidic communication with one another via the membrane 720.

Figure 7D:
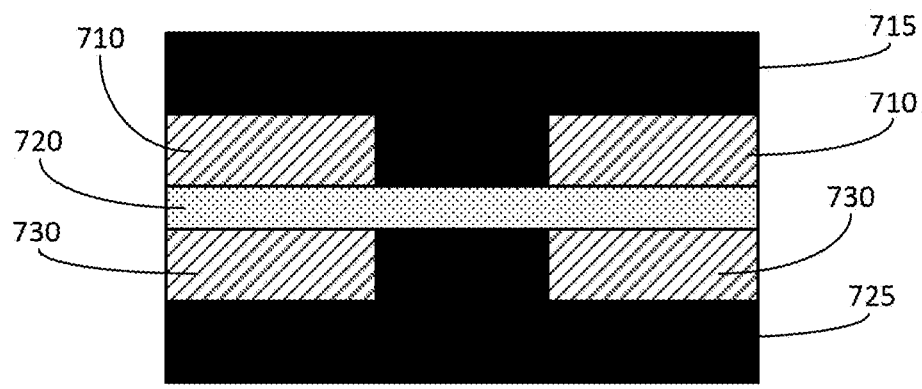

The method 600 can include injection molding a second channel layer (BLOCK 620). The results of this stage are shown in FIG. 7D. In some implementations, a polymer material, such as COC, COP, or polystyrene, among others, can be injected into the mold to fill the voids in the second support structure 725, thereby defining the second channel layer 730. In some implementations, the material selected for the second channel layer 730 can be the same material selected for the first channel layer 710. In some implementations, the material selected for the second channel layer 730 can be different from the material selected for the first channel layer 710.

Figure 7E:
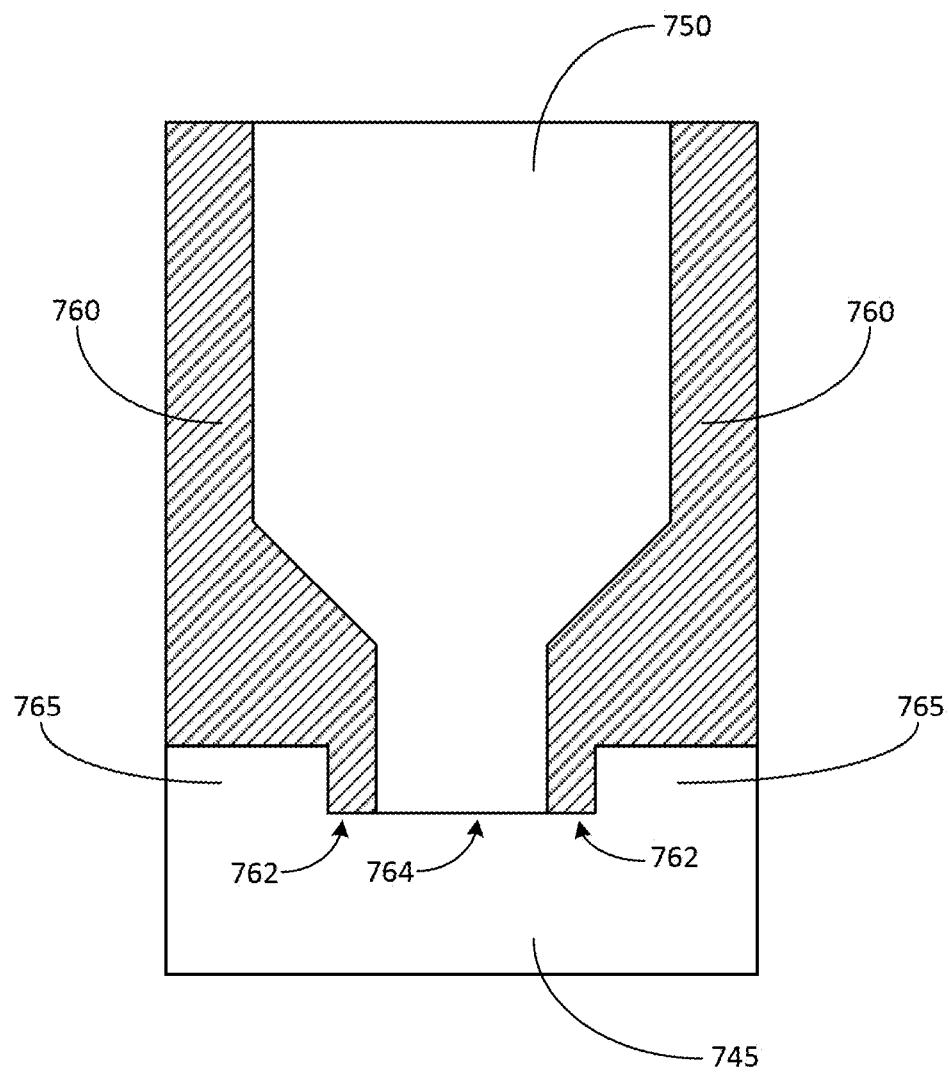

The method 600 can include providing a well plate (BLOCK 625). In some implementations, the well plate can be manufactured separately from the first channel layer 710 and the second channel layer 730 depicted in FIGS. 7A-7D. In some implementations, the well plate can be fabricated using a separate injection molding technique. An example of such a technique is depicted in FIG. 7E. As shown, a first mold piece 745 and a second mold piece 750 can be used. A polymer material, such as COC, COP, or polystyrene, among others, can be injected into the negative space defined by the first mold piece 745 and the second mold piece 750 to form the well plate 760. In some implementations, the material selected for the well plate 760 can be the same as the material selected for either or both of the first channel layer 710 or the second channel layer 730. In some implementations, the material selected for the second channel layer 730 can be different from the material selected for either or both of the first channel layer 710 and the second channel layer 730.

The well plate 760 can be similar to the well plates 360, 460, and 560 shown in FIGS. 3-5. For example, the well plate 760 can include at least one central opening (e.g., defined by the second mold piece 750) through which a fluid sample can be introduced into an underlying channel or chamber after the well plate 760 is secured to a remainder of the microfluidic device. However, the well plate 760 can differ from the well plates 360, 460, and 560 in that the well plate 760 can include a sealing lip 762, which may also be referred to herein as a sealing portion 762. The sealing lip 762 can protrude from a remaining portion of the well plate 760, which can be referred to as a support portion of the well plate 760. The sealing lip 762 can at least partially surround the opening 764 defined by the well plate 760. In contrast to conventional well plates that do not include a sealing lip, the well plate 760 with the sealing lip 762 can be used to facilitate an improved bonding process that can result in better bond quality and less risk of damage to the well plate 760 or to other components (e.g., channel layers, membranes, etc.) of the microfluidic device, as described further below.

The method 600 can include positioning the well plate within the mold (BLOCK 630). The well plate 760 can be positioned inside the mold such that sealing lip 762 of the well plate 760 is in contact with the first channel layer 710. The opening of the well plate 760 also can be aligned with a channel defined by the first channel layer 710. When the sealing lip 762 is brought into contact with the first channel layer 710, the sealing lip 762 can serve as a seal that surrounds the opening in the well plate 760.

Figure 7F:
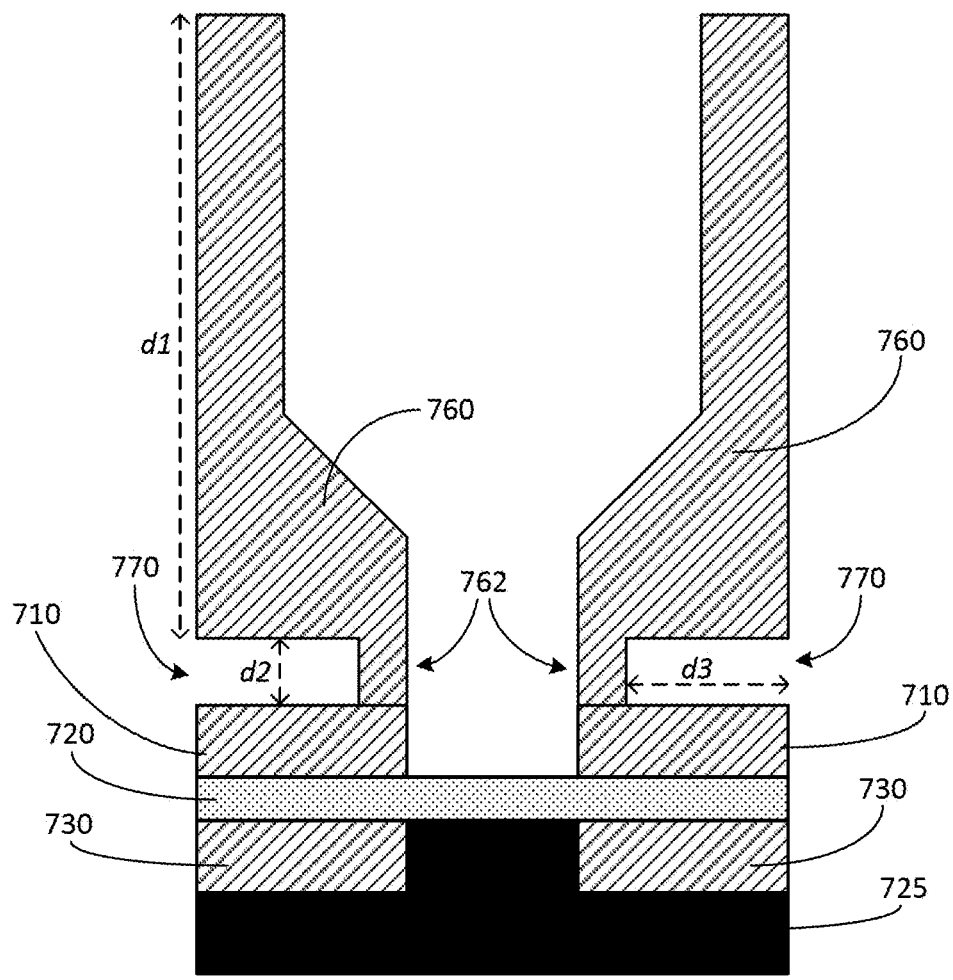

As depicted in FIG. 7F, when the sealing lip 762 is positioned in contact with the first channel layer 710, a gap can exist between the remaining portion of well plate 760 and the first channel layer 710. The gap can have a height that extends a distance labeled d2 and a width that extends a distance labeled d3 in FIG. 7F. Stated differently, relative to a first end (e.g., a top end) of the well plate 760, the support portion can extend a distance labeled d1 in FIG. 7F, while the sealing lip 762 extends an additional distance d2. As a result, a cavity 770 can exist between the well plate 760 and the first channel layer 710. The cavity can span a width having the distance d3 and a height having the distance d2. This cavity 770 is sealed from the channel defined in the first channel layer 710 by the sealing lip 762.

The method 600 can include injecting a polymer material into the mold to fill the cavity 770 defined by the first channel layer 710 and portions of the well plate 760 (BLOCK 635). The polymer material can be injected into the cavity 770. Because the sealing lip 762 seals the cavity 770 from the channel, the injected polymer material is prevented from leaking into the channel. In some implementations, the injection of the polymer material can be achieved through an injection molding process. In addition, the injected polymer material can adhere the well plate 760 to the first channel layer 710. This bonding technique therefore results in several technical improvements, relative to conventional laser welding, ultrasonic welding, and other techniques described above. For example, burning or warping of the materials of the well plate 760 and the first channel layer 710 can be avoided, because there is no need to use a technique such as laser welding that can subject the materials to temperatures that may cause such damage.

In addition, a secure bond can be formed between the well plate 760 and the first channel layer 710 without the risk of collapsing any portion of the first channel layer 710, the membrane 720, or the second channel layer 730. For example, as described above, bonding techniques that require pressure to be applied to a material stack can cause layers of the stack to deform out of plane (e.g., collapse into channels or chambers defined by adjacent layers) in areas where there may not be a rigid substrate or other support structure to prevent such collapse. Using the technique described in this disclosure, which includes providing an well plate 760 having an sealing lip 762 and injecting a polymer material to fill the cavity 770 between the well plate 760 and the adjacent first channel layer 710, can dispense with the need to apply pressures that can increase the risk of layers collapsing during the bonding process.

In some implementations, the dimensions of the sealing lip 762 and the cavity 770 can be selected to facilitate a strong bond between the well plate 760 and the first channel layer 710. In some implementations, the distance d2 (e.g., the height of the sealing lip 762 or the distance to which the sealing lip 762 protrudes from the supporting portion of the well plate 760) can be selected to be about 1%, about 5%, about 10%, about 15%, about 20%, or any other amount between and including 1% and 20%, of the distance d1. In some implementations, the distance d3 (e.g., the width of the cavity 770) can be selected to be substantially equal to the distance d2. In some other implementations, the distance d3 can be selected to be about 25% larger than the distance d2, about 50% larger than the distance d2, or about 75% larger than the distance d2. In still other implementations, the distance d3 can be selected to about twice the distance d2, about three times the distance d2, about 4 times the distance d2, or about 5 times the distance d2. Other dimensions are also possible.

Figure 7G:
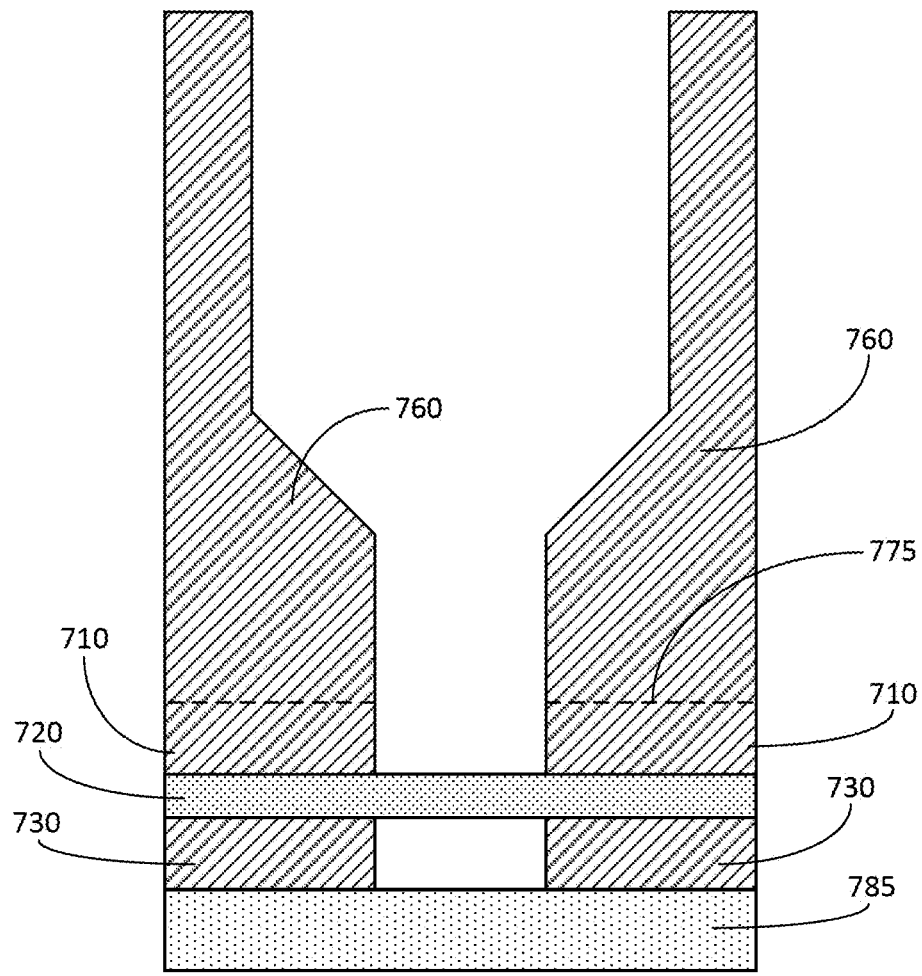

The results of BLOCK 635 are shown in FIG. 7G. As depicted, the well plate 760 and the first channel layer 710 are bonded by the injection of the polymer material in BLOCK 635 to form what appears to be a monolithic component after the injection of the polymer material is complete. The broken line 785 depicts the interface region between the first channel layer 710 and the well plate 760 for illustrative purposes, however it should be understood that in practice the well plate 760 and the first channel layer 710 may appear to a single integral component after the bonding process is complete.

The method 600 can include curing the polymer material that was injected into the cavity 770 (BLOCK 640). In some implementations, the polymer material injected into the cavity 770 can be the same material as at least one of the well plate 760 and the first channel layer 710. For example, the well plate 760, the first channel layer 710, and the polymer material injected into the cavity can each be selected to be the same material, or to be materials that are compatible with one another for bonding purposes via the injection molding technique described in this disclosure. In some implementations, the polymer material injected into the cavity 770 can be COP, COC, or polystyrene, among others.

In some implementations, the method 600 can include additional or different steps than those depicted in FIG. 6. For example, additional or different layers or components can be added to the microfluidic device in other steps. In some implementations, the method 600 can include coupling an optical layer to the microfluidic device. For example, as depicted in FIG. 7G, an optical layer 785 can be added to the second channel layer 730, on the opposite side of the second channel layer 730 from the membrane 720 and the first channel layer 710. The second solid support structure 725 can be removed before the optical layer 785 is added. The optical layer 785 can be similar to the optical layer 125 shown in FIG. 1. The optical layer 785 can be formed from a transparent material and can facilitate observation of fluid samples or other substances in the channels defined in the second channel layer 730. The optical layer 785 can be made from a transparent plastic or other type of transparent material, such as glass. In some implementations, the optical layer 785 can be coupled to the microfluidic device via one or more attachment processes described herein, including laser welding, ultrasonic welding, solvent bonding, or thermal bonding.

Figure 8:
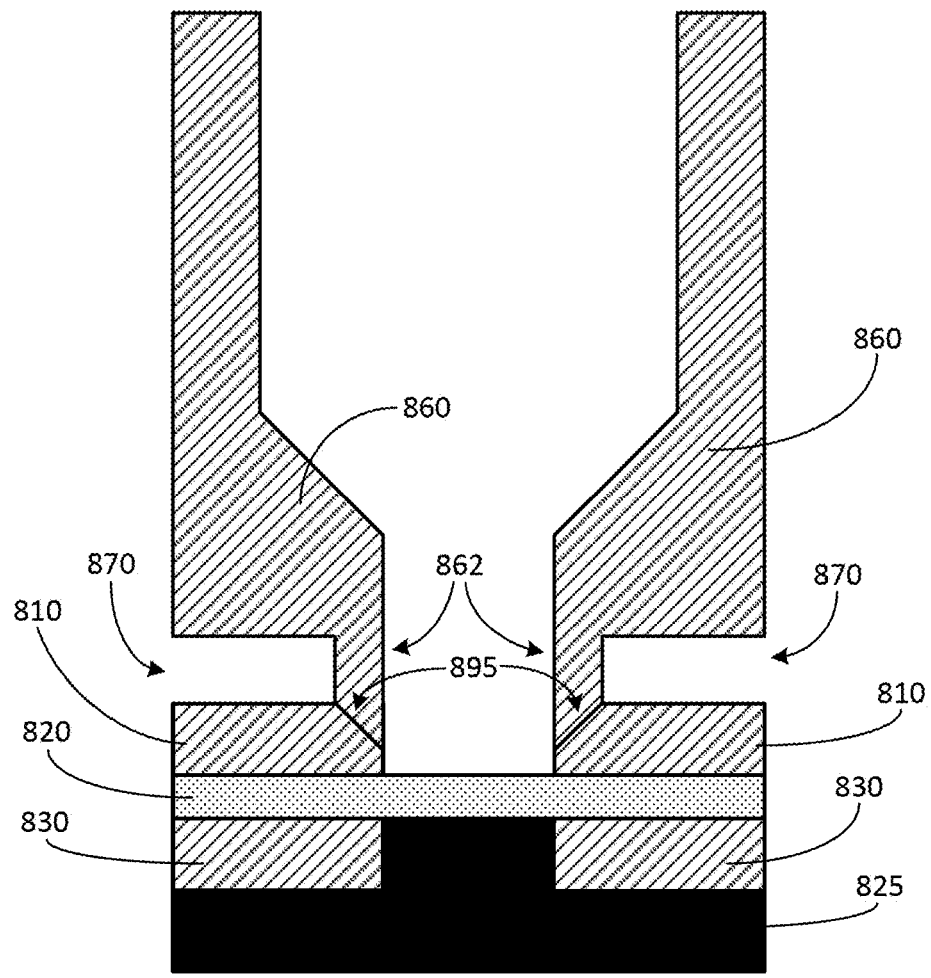
FIG. 8 illustrates a cross-sectional view of an alternative geometry for components of the microfluidic device shown in FIGS. 7A-7G.

FIG. 8 illustrates a cross-sectional view of an alternative geometry for components of the microfluidic device shown in FIGS. 7A-7G. The components of FIG. 8 are similar to the components shown in FIGS. 7A-7G, and like reference numerals refer to like components in these figures. The device shown in FIG. 8 differs from that shown in FIGS. 7A-7G in that the well plate 860 of FIG. 8 includes a sealing lip 862 having a beveled edge 895, rather than a straight edge. The beveled edge 895 extends downward at an angle away from the remaining portion of the well plate 860. In addition, the first channel layer 810 also includes a beveled edge having an angle that matches the angle of the beveled edge 895, such that the beveled edge of the sealing lip 862 sits flush against the edge of the first channel layer 810. To bond the well plate 860 to the first channel layer 810, a polymer material can be injected into the cavity 870, similar to the process described above in connection with FIGS. 6 and 7A-7G.

Due to the angle of the beveled edge 895 of the sealing lip 862, the sealing lip 862 can exert an outward force (e.g., away from the central axis of the opening of the well plate 860) on the first channel layer 810. As described above, the membrane 820 may be bonded or adhered to the first channel layer 810. Thus, the outward force exerted by the beveled edge 895 of the sealing lip 862 on the first channel layer 810 can introduce tension into the membrane 820, thereby increasing the flatness of the membrane 820. As a result, the membrane 820 may be less likely to collapse or deform out of plane (e.g., into the channels defined in the first channel layer 810 or the second channel layer 830.

Figure 9:
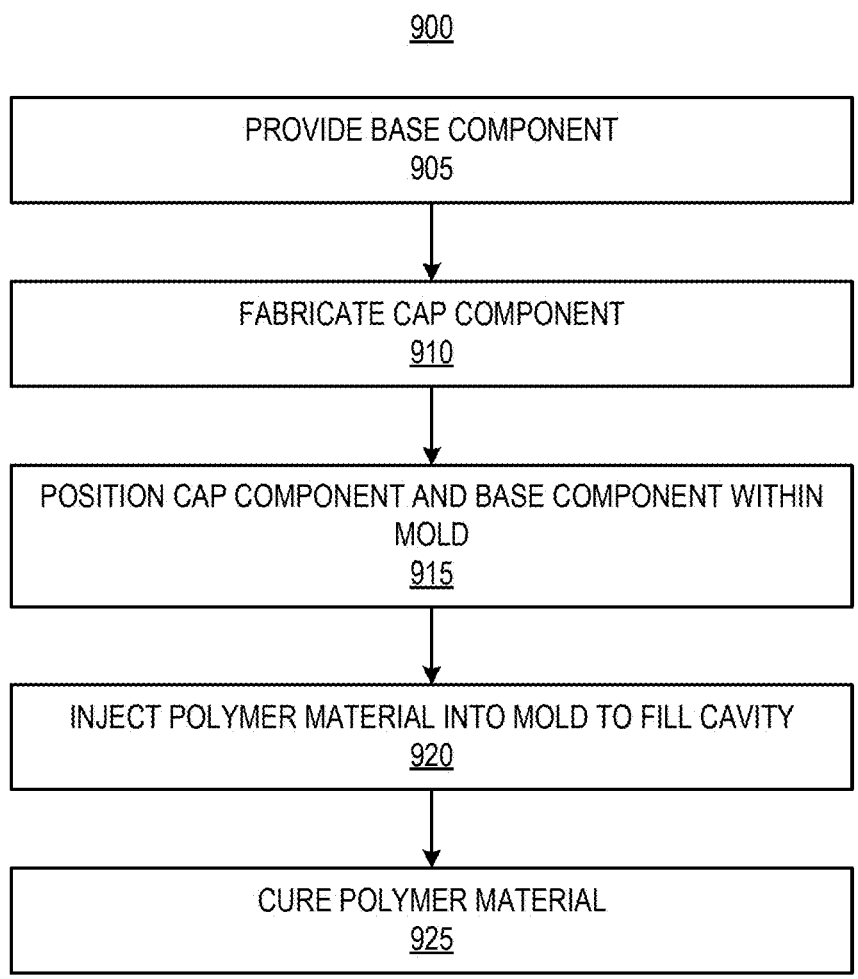
FIG. 9 illustrates a flowchart of an example method for fabricating a closed microfluidic device.

It should be understood that the manufacturing technique described above in connection with FIG. 6 can be used to fabricate devices different from the device depicted in FIGS. 7A-7G and 8. For example, similar techniques can be applied to any closed microfluidic device, which may include a device defining a feature such as a channel or a chamber that is at least partially enclosed on its top and bottom surfaces. FIG. 9 illustrates a flowchart of an example method 900 for fabricating such a closed microfluidic device.

Referring now to FIG. 9, the method 900 can include providing a base component (BLOCK 905). In some implementations, the base component can define a first portion of a channel or a chamber of the microfluidic device. For example, the base component can be a channel layer similar to either of the first channel layer 710 or the second channel layer 730 depicted in FIGS. 7A-7G. The base component can also include additional features. For example, the base component itself may include a plurality of layers, each or which may define a respective channel or chamber (or a respective network of channels or chambers). The base component can be formed, for example, from a polymer material such as COC, COP, or polystyrene.

The method 900 can include fabricating a cap component of the microfluidic device (BLOCK 910). In some implementations, the cap component can include a sealing lip. For example, the sealing lip can be similar to the sealing lip 762 shown in FIG. 7E. The sealing lip can extend a first distance from a first side of the cap component. The sealing lip can protrude from a support portion of the cap component, which may extend a second distance, less than the first distance, from the first side of the cap component. The cap component may be a well plate, similar to the well plate 760 of FIGS. 7A-7G. In some other implementations, the cap component can be a simpler component that may not include any openings providing access to interior channels. For example, the cap component may instead define sidewalls and a ceiling or floor of a channel or chamber, similar to the first channel layer 710 or the second channel layer 730 depicted in FIGS. 7A-7G, with the addition of a sealing lip. In some implementations, the cap component can be formed from a polymer material such as COC, COP, or polystyrene, among others. In some implementations, the cap component can be formed from the same material as the base component.

The method can include positioning the cap component and the base component within a mold (BLOCK 915). In some implementations, the cap component and the base component can be positioned inside the mold such that the sealing lip of the cap component is brought in contact with the base component. The base component can be spaced away from the support portion of the cap component by a third distance equal to a difference between the first distance and the second distance. The base component, the support portion of the cap component, and the sealing lip of the cap component together can define a cavity that is sealed from the channel of the microfluidic device by the sealing lip of the cap component.

The method can include injecting a polymer material into the mold to cause the polymer material to fill at least a portion of the cavity defined by the base component, the support portion of the cap component, and the sealing lip of the cap component (BLOCK 920). The injected polymer material can cause the base component to become adhered to the cap component. In some implementations, the polymer material can be the same material as one or both of the base component and the cap component. For example, the base component, the cap component, and the polymer material injected into the cavity can each be selected to be the same material, or to be materials that are compatible with one another for bonding purposes via the injection molding technique described in this disclosure. In some implementations, the polymer material injected into the cavity can be COP, COC, or polystyrene.

The method can also include curing the polymer material to secure the base component to the cap component (BLOCK 925). After the polymer material is cured, the base component and the cap component may be bonded to form what appears to be a monolithic microfluidic device. In some implementations, other components may be added to the microfluidic device in additional steps. For example, an optical layer may be added to allow for fluid samples or other substances inside the microfluidic device to be observed or imaged.

Figure 10A:
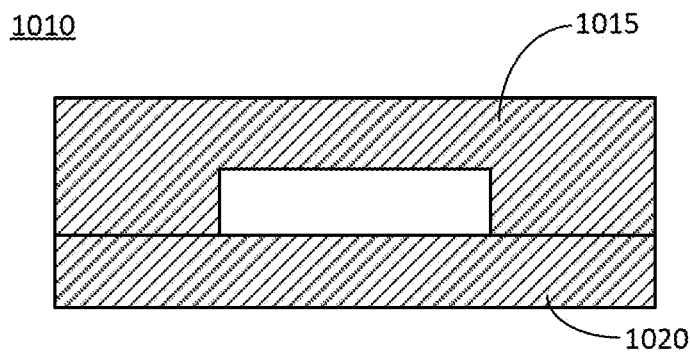
FIGS. 10A-10C illustrate cross-sectional views of material stacks that can be used to form closed microfluidic devices.
Figure 10B:
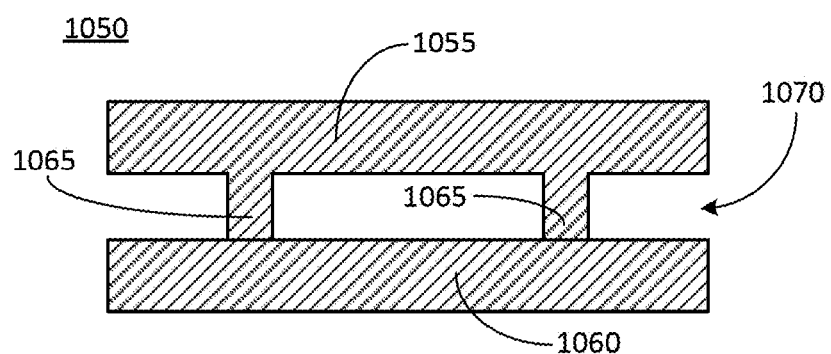
Figure 10C:
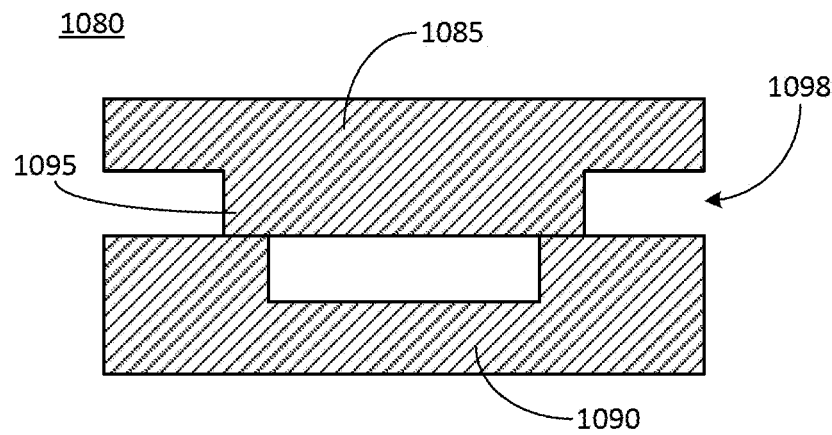

FIGS. 10A-10C illustrate cross-sectional views of material stacks that can be used to form closed microfluidic devices. The material stacks shown in FIGS. 10A-10C show the distinctions between devices manufactured using traditional bonding techniques as compared to devices fabricated using the injection molding technique described in this disclosure. Referring to FIG. 10A, a material stack 1010 is shown. The material stack 1010 includes a cap component 1015 and a base component 1020. The cap component 1015 and the base component 1020 meet at a flat interface suitable for bonding via conventional techniques. As described above, such techniques typically require at least one a temperature or a pressure that risks damaging components of the device, such as by burning the materials or causing material deformation or collapse.

In contrast, FIGS. 10B and 10C show material stacks that make use of a sealing lip to facilitate bonding via injection molding, as described above. In some implementations, the material stacks of FIGS. 10B and 10C can be bonded to one another to produce a closed microfluidic device using the method 900 described above in connection with FIG. 9. Referring now to FIG. 10B, a material stack 1050 is shown. The material stack 1050 includes a cap component 1055 and a base component 1060. The cap component 1055 includes a sealing lip 1065 that extends away from a remaining portion of the cap component 1055. When the cap component 1055 is brought in contact with the base component 1060, as depicted in FIG. 10B, the sealing lip 1065 of the cap component 1055 rests against the flat surface of the base component 1060, leaving a cavity 1070 that is sealed off from the central channel of the device. To bond the cap component 1055 to the base component 1060, a polymer material can be injected into the cavity 1070. The polymer material can bond the cap component 1055 to the base component 1060, while the sealing lip 1065 prevents the injected polymer material from leaking into the central channel of the device.

Similarly, FIG. 10C shows a material stack 1080 having a cap component 1085 and a base component 1090. The cap component 1085 includes a sealing lip 1095. Unlike the sealing lip 1065 shown in FIG. 10B, the sealing lip 1095 of FIG. 10C extends across the entire central channel defined between the cap component 1085 and the base component 1090, rather than surrounding the channel. A cavity 1098 exists outside of the lip 1098 when the cap component 1085 is positioned in contact with the base component 1090 in the arrangement shown in FIG. 10C. The cavity 1098 is sealed off from the central channel of the device. To bond the cap component 1085 to the base component 1090, a polymer material can be injected into the cavity 1095. The polymer material can bond the cap component 1085 to the base component 1090, while the sealing lip 1095 prevents the injected polymer material from leaking into the central channel of the device.

It should be appreciated that the geometries of the material stacks shown in FIGS. 10B and 10C are illustrative only, and that microfluidic devices can be manufactured using a material stack that includes a sealing lip to define a cavity with other geometries as well. For example, in the examples of FIGS. 10B and 10C, the sealing lip could instead be a portion of the base component, rather than the cap component. Other variations are also possible. These arrangements can overcome technical challenges of using conventional bonding techniques and material stack geometries, which can have adverse effects on the materials that form the base component and cap component. For example, as described above, some bonding techniques may burn or melt portions of the base component or cap component. As a result, the microfluidic device may have dimensions that are distorted as a result of such burning or melting. The manufacturing techniques provided in this disclosure allow for fabrication of closed microfluidic devices in a manner that overcomes these challenges. In some implementations, the geometry and dimensions of the base component or the cap component can be selected to facilitate injection molding in a manner that prevents or reduces deformation of the microfluidic device that may otherwise occur as a result of temperatures and pressures applied during the molding process.

While operations are depicted in the drawings in a particular order, such operations are not required to be performed in the particular order shown or in sequential order, and all illustrated operations are not required to be performed. Actions described herein can be performed in a different order.

The separation of various system components does not require separation in all implementations, and the described program components can be included in a single hardware or software product.

Having now described some illustrative implementations, it is apparent that the foregoing is illustrative and not limiting, having been presented by way of example. In particular, although many of the examples presented herein involve specific combinations of method acts or system elements, those acts and those elements may be combined in other ways to accomplish the same objectives. Acts, elements, and features discussed in connection with one implementation are not intended to be excluded from a similar role in other implementations.

The phraseology and terminology used herein is for the purpose of description and should not be regarded as limiting. The use of "including," "comprising," "having," "containing," "involving," "characterized by," "characterized in that," and variations thereof herein is meant to encompass the items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

As used herein, the terms "about" and "substantially" will be understood by persons of ordinary skill in the art and will vary to some extent depending upon the context in which they are used. If there are uses of the term which are not clear to persons of ordinary skill in the art given the context in which it is used, "about" will mean up to plus or minus 10% of the particular term.

Any references to implementations or elements or acts of the systems and methods herein referred to in the singular may also embrace implementations including a plurality of these elements, and any references in plural to any implementation or element or act herein may also embrace implementations including only a single element. References in the singular or plural form are not intended to limit the presently disclosed systems or methods, their components, acts, or elements to single or plural configurations. References to any act or element being based on any information, act, or element may include implementations where the act or element is based at least in part on any information, act, or element.

Any implementation disclosed herein may be combined with any other implementation or embodiment, and references to "an implementation," "some implementations," "one implementation," or the like are not necessarily mutually exclusive and are intended to indicate that a particular feature, structure, or characteristic described in connection with the implementation may be included in at least one implementation or embodiment. Such terms as used herein are not necessarily all referring to the same implementation. Any implementation may be combined with any other implementation, inclusively or exclusively, in any manner consistent with the aspects and implementations disclosed herein.

The indefinite articles "a" and "an," as used herein in the specification and in the claims, unless clearly indicated to the contrary, should be understood to mean "at least one."

References to "or" may be construed as inclusive so that any terms described using "or" may indicate any of a single, more than one, and all the described terms. For example, a reference to "at least one of 'A' and 'B'" can include only 'A', only 'B', as well as both 'A' and 'B'. Such references used in conjunction with "comprising" or other open terminology can include additional items.

Where technical features in the drawings, detailed description, or any claim are followed by reference signs, the reference signs have been included to increase the intelligibility of the drawings, detailed description, and claims. Accordingly, neither the reference signs nor their absence has any limiting effect on the scope of any claim elements.

The devices, systems, and methods described herein may be embodied in other specific forms without departing from the characteristics thereof. The foregoing implementations are illustrative rather than limiting of the described devices, systems, and methods. Scope of the devices, systems, and methods described herein is thus indicated by the appended claims, rather than the foregoing description, and changes that come within the meaning and range of equivalency of the claims are embraced therein.

What is claimed is:

1. A microfluidic device, comprising:
   a base component defining at least a portion of a first channel of the microfluidic device;
   a cap component comprising a sealing lip extending a first distance from a first side of the cap component and a support portion extending a second distance, less than the first distance, from the first side of the cap component; and
   a polymer material filling at least a portion of a cavity defined by the base component, the support portion of the cap component, and the sealing lip of the cap component, wherein the cavity is sealed from the first channel of the microfluidic device by the sealing lip of the cap component, wherein the polymer material is injection molded to fill the cavity and cured to secure the base component to the cap component.

2. The microfluidic device of claim 1, comprising a second channel complementary to the first channel, the second channel defined at least in part by the base component of the microfluidic device.

3. The microfluidic device of claim 2, further comprising a semi-permeable membrane separating the first channel from the second channel.

4. The microfluidic device of claim 2, further comprising a well plate formed as part of the cap component of the microfluidic device, the well plate defining at least one opening in fluidic communication with the first channel or the second channel of the microfluidic device.

5. The microfluidic device of claim 2, further comprising an optical layer coupled with the base component or the cap component to facilitate observation of the microfluidic device.

* * * * *